(12) United States Patent
Nyhus et al.

(10) Patent No.: US 7,374,865 B2
(45) Date of Patent: *May 20, 2008

(54) METHODS TO PATTERN CONTACTS USING CHROMELESS PHASE SHIFT MASKS

(75) Inventors: Paul Nyhus, Portland, OR (US); Sam Sivakumar, Portland, OR (US)

(73) Assignee: Intel Corporation, Santa, CA (US)

( * ) Notice: Subject to any disclaimer, the term of this patent is extended or adjusted under 35 U.S.C. 154(b) by 286 days.

This patent is subject to a terminal disclaimer.

(21) Appl. No.: 10/304,303

(22) Filed: Nov. 25, 2002

(65) Prior Publication Data

US 2004/0101764 A1    May 27, 2004

(51) Int. Cl.
G03F 7/20 (2006.01)
G03F 7/40 (2006.01)
(52) U.S. Cl. .................................. 430/311; 430/313
(58) Field of Classification Search ................ 430/311, 430/313, 317, 319, 323; 438/719, 725, 733, 438/735, 745, 753
See application file for complete search history.

(56) References Cited

U.S. PATENT DOCUMENTS

| | | | | |
|---|---|---|---|---|
| 5,766,829 | A * | 6/1998 | Cathey et al. | 430/394 |
| 5,998,069 | A * | 12/1999 | Cutter et al. | 430/5 |
| 6,096,458 | A * | 8/2000 | Hibbs | 430/5 |
| 6,563,566 | B2 * | 5/2003 | Rosenbluth et al. | 355/67 |
| 7,056,645 | B2 * | 6/2006 | Sivakumar et al. | 430/311 |
| 2003/0027366 | A1 * | 2/2003 | Dulman et al. | 438/16 |
| 2003/0064297 | A1 * | 4/2003 | Shiota et al. | 430/5 |
| 2004/0161675 | A1 * | 8/2004 | Lin | 430/5 |

OTHER PUBLICATIONS

Levinson, Harry J., Principles of Lithography, 2001, SPIE—The International Society for Optical Engineering, pp. 261-263.*
Grant, Roger and Claire, Grant & Hackh's Chemical Dictionary, Fifth Edition, 1987, McGraw-Hill, Inc., p. 487.*

* cited by examiner

*Primary Examiner*—Mark F. Huff
*Assistant Examiner*—John Ruggles
(74) *Attorney, Agent, or Firm*—Blakely, Sokoloff, Taylor & Zafman LLP

(57) ABSTRACT

Method for using chromeless phase shift lithography (CPL) masks to pattern contacts on semiconductor substrates and corresponding CPL masks for performing the method. The method for patterning contacts includes illuminating a CPL mask comprising a reticle having a plurality of phase-shifting features interspersed with non-phase-shifting areas using a short wavelength UV light source, wherein the phase-shifting features are configured in a pattern corresponding to a target pattern of the contacts on the semiconductor substrate. Phase-shifted and non-phase-shifted light passing through the reticle are projected as an aerial image onto a layer of a negative tone resist applied over the semiconductor substrate to pattern the contacts in the resist. The phase-shifting features are recesses which cause light passing therethrough to be phase-shifted by approximately 180° from light passing through non-phase-shifting areas of the mask. Each recess in the CPL mask is used to pattern a separate contact on the semiconductor substrate.

10 Claims, 11 Drawing Sheets

METHODS TO PATTERN CONTACTS USING CHROMELESS PHASE SHIFT MASKS

FIELD OF THE INVENTION

The field of invention relates generally to semiconductors and, more specifically but not exclusively relates to a method for patterning contacts in semiconductor substrates through the use of chromeless phase shift masks.

BACKGROUND INFORMATION

Chromeless phase shift lithography (CPL) has been investigated for many years as a possible single-mask resolution enhancement technique for lines/spaces in semiconductor devices. For positive resists, it is particularly well-suited to the patterning of semi-isolated narrow lines but not to dense line/spaces or contacts. However, with significant mask design effort and added mask complexity, contacts and semi-dense line/spaces have been successfully patterned. Like other phase shifting techniques, such as alternating PSM (phase shift mask), CPL can provide significantly better aerial image contrast compared to binary masks; unlike alternating PSM, however, it is a single mask single exposure technique avoiding many of the dual-reticle concerns such as throughput, mask layout, and reticle-to-reticle overlay.

CPL uses phase edges between 0° and 180° phase shift regions on the mask to pattern lines along the phase edges. This is possible without chrome because destructive interference of light diffracted from regions immediately on either side of the phase edge result in an aerial image minimum at the wafer corresponding to the phase edge, with excellent contrast if it is isolated enough. With just one phase edge defining lines, it would be impossible to pattern arbitrary layouts without a second mask to clear unwanted phase edges. CPL allows one to avoid using a second mask by patterning narrow lines with two closely-spaced parallel phase edges that cannot be resolved. The combined aerial image of the two parallel phase edges is still a deep single minimum that patterns as one line but now the "line" on the reticle (mask) can be drawn just as it would with chrome, wherein the chrome is replaced by a phase shifted region. However, this only works for lines that are not wide; if the phase shifted line becomes too wide, i.e. the two phase edges of the line move too far apart, then they become individually resolvable and will pattern as two parallel lines. If the phase shifted line is too narrow, the aerial image contrast gets worse very quickly as the phase shifted region become smaller and looks more like a uniform piece of quartz. These two cliffs constrain the size of phase shift lines to a relatively tight range of small widths.

These effects are illustrated in the aerial image diagram of FIG. 1, which corresponds to a simulation with 193 nm light, a 0.68 NA (numeric aperture) projection lens, and quadrupole illumination (0.1 sigma poles at 0.7 sigma radii along line/space axes). The ideal case corresponds to a 0.1 µm separation, which produces a deep single minimum. As the separation width increases, the aerial image results in a pair of minimums being produced, as shown by the 0.2 µm and 0.5 µm separation curves. For example, a separation of 0.5 µm would result in two lines being resolved. This of course is undesired. As a result, wider lines are typically patterned using a binary (i.e., chrome-patterned) reticle.

A similar evolution occurs for isolated CPL contact aerial images, as shown in FIG. 2, which illustrates aerial image dependence on contact size for dense (0.20 µm pitch 2D grid) contact spacing. As the CD (critical dimension) increases, the minimum drops quickly and the normalized image log slope (NILS) rises. At some critical size, the minimum begins increasing and the maxima continue to decrease, causing the NILS to get worse to the point at which contact holes cannot be patterned.

Another widely recognized difficulty with CPL for line/space patterning arises when trying to pattern dense 1:1 (equal line and space widths) line/spaces. As the line pitch becomes tighter, the contrast of the aerial images of the lines quickly becomes worse until it is just a flat background, as shown by the solid-line curve of FIG. 3. This loss of contrast prevents CPL from being easily used to produce lines at tight pitches. This complete patterning failure for dense lines/spaces has been one reason that CPL has not been widely used in practice.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 6A 6B, and 6C, respectively, show various stages of a conventional semiconductor manufacturing process, wherein FIG. 6A illustrates a substrate configuration after exposed positive tone resist has been removed, FIG. 6B illustrates the process stage after contact holes have been etched, and FIG. 6C illustrates the process stage after the unexposed positive tone resist has been removed;

FIGS. 11A, 11B, and 11C respectively shown various stages of the photolithography process of FIG. 10, wherein FIG. 11A illustrates a substrate configuration after unexposed negative tone resist as been removed, FIG. 11B illustrates the process stage after contact holes have been etched, and FIG. 11C illustrates the process stage after the exposed negative tone resist has been removed.

DETAILED DESCRIPTION OF PREFERRED EMBODIMENTS

Embodiments of methods and apparatus for patterning contacts using chromeless phase shift masks are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Integrated circuits (IC's) are manufactured from a semiconductor substrate, such as a silicon wafer, using a series of processing steps. Generally, the various electronic elements (e.g., transistors, gates, etc.) of an IC are first formed using processing steps particular to the type of transistor being employed by the chip. For example, for CMOS (complementary metal oxide) IC's, these steps include depositing various layers, combined with various lithography steps, etching steps, and implantation steps to form the electronic elements. These electronic elements are then "integrated" via conductive (e.g., copper, aluminum, etc.) lines paralled to the substrate surface and contacts perpendicular to the surface. To generate the contact electrical connections, holes must first be produced in the insulating material above the transistors. These contact holes, when filled with the conductive material, provide an electrical path between selected electronic elements.

Figure 4A:
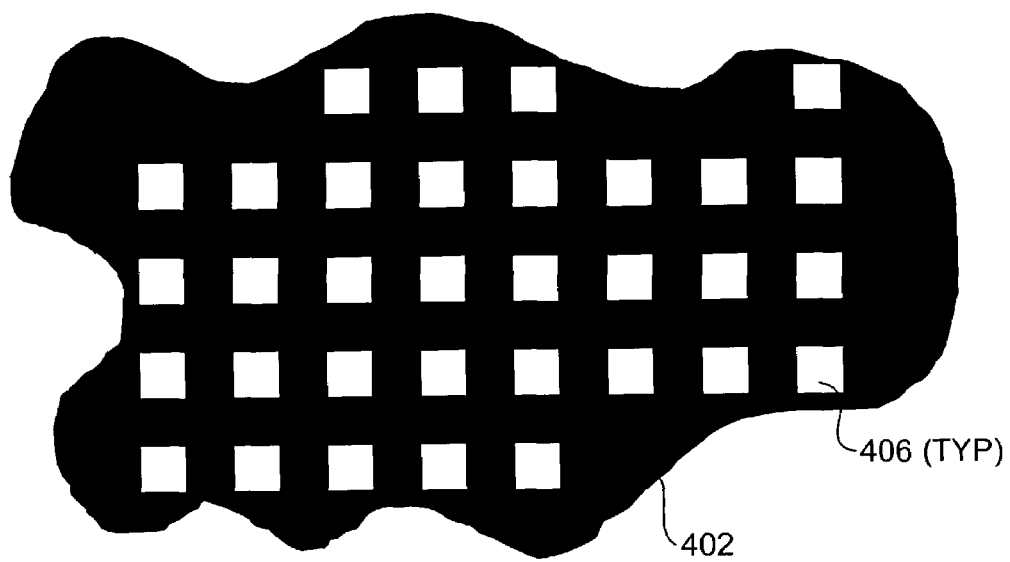
FIGS. 4A and 4B respectively show plan and elevation views of a conventional chrome phase-shaft mask.
Figure 4B:

Under conventional manufacturing techniques, the contact holes are formed by exposing a positive tone resist layer coated on the substrate through a binary mask or ePSM (attenuated PSM). As shown in FIGS. 4A and 4B, a conventional lithography mask 400 comprises an opaque chrome layer (or partially transmissive material for attenuated phase shift lithography) 402 patterned on a quartz reticle 404. The chrome layer is constructed to contain a plurality of apertures 406, which comprises areas of the reticle over which a chrome layer is not formed (or removed).

During the contact hole formation process, a short wavelength (e.g., 248 nm, 193 nm or 157 nm Deep ultra-violet (DUV)) light source is employed to illuminate the reticle. Most of this light impinges on the light-blocking layer. In the case of ePSMs, the light-blocking layer is "leaky," or partially opaque to the selected wavelength, providing approximately 6% transmission for light at the short wavelength. By using an appropriate layer thickness for the selected wavelength, the portion of light passing through these areas is shifted 180° in phase with respect to the light passing through the apertures. The phase shifted and non-phase shifted light is then passed through a set of lithography optics, which focuses the light onto an area of the positive-tone photoresist in which the contact holes are to be formed. The exposed areas are then used to form the contact holes through subsequent operations in the manner described below.

Figure 5B:
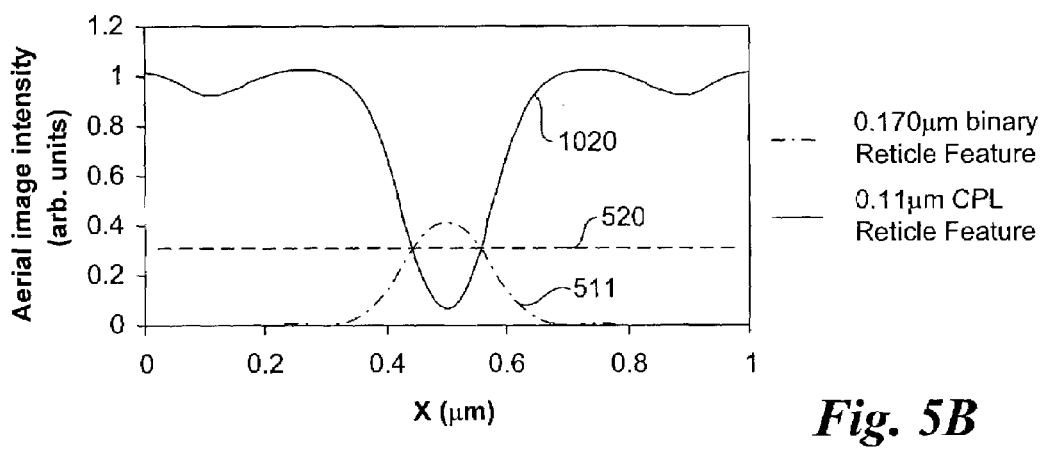
FIG. 5B is a graphic comparing isolated contact aerial intensities with a CPL mask and a conventional binary mask under the same stepper conditions (193 nm light, 0.68 NA, quadrupole illumination)
Figure 5A:
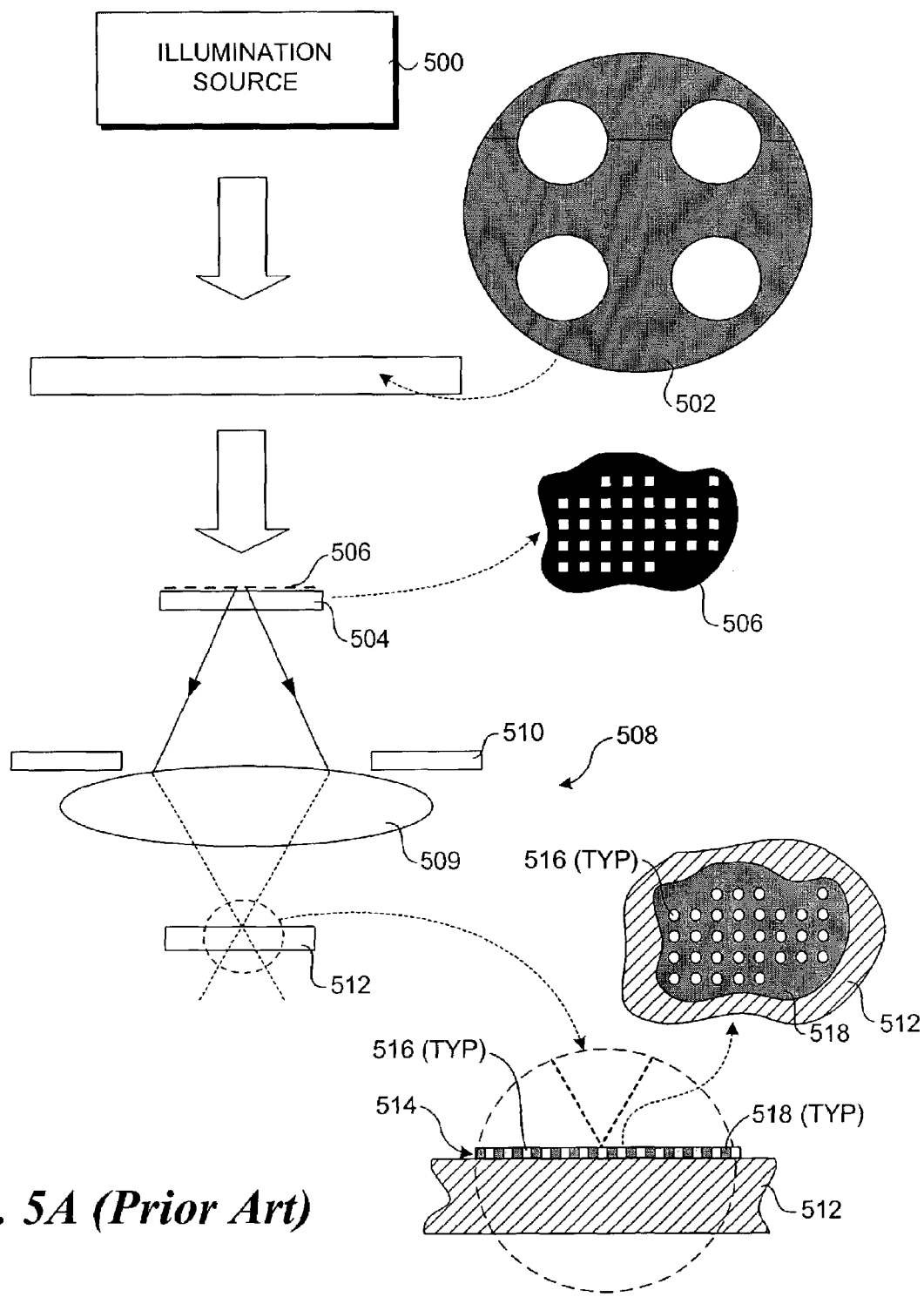
FIG. 5A is a schematic diagram illustrating a conventional photolithography process employing an attenuated phase-shift mask.

Generally, in order to achieve finer features for a given set of optical parameters (e.g., $\lambda$ and NA), it is advantageous to use off-axis illumination. An example of an off-axis illumination apparatus that forms contact holes using a conventional chrome reticle is shown in FIG. 5A. A short wavelength illumination source 500 emits light at a wavelength appropriate for the process (e.g., 248 nm or 193 nm). The light from the light source is redirected by optical elements 502 to produce, for example, a quadrupole light source. In this case, the quadrupole poles are positioned off the optical axis of the stepper in such a way that most of the light from the source impinges on the reticle at an acute angle with little light impinging perpendicular to a reticle 504, which includes a light-blocking layer 506. For purposes of clarity, the size of the reticle is exaggerated. As discussed above, portions of the light impinging on the blocking areas of the reticle are shifted 180° in phase when they pass through the reticle. Portions of the light impinging on areas of the reticle not having the blocking material (i.e., the apertures formed in the blocking layer 506) are allowed to pass through the reticle without a phase shift. These portions of light then pass through a projection system 508, depicted as a lens 509 disposed behind an aperture 510 for simplicity; in practice, the projection system may typically employ other optical components that are not shown. The projection system is used to redirect the light toward a focal plane in which a semiconductor substrate 512 coated with positive tone photoresist is placed, producing an aerial image having an intensity curve similar to the binary contact aerial image intensity curve 511 shown in FIG. 5B.

As shown in the blown-up detail of FIG. 5A, a positive tone resist layer 514 is applied (e.g., via spin coating) to the top surface of substrate 512. Some areas of the resist 516 (indicated by the light areas) are exposed to the higher doses of light, while other areas 518 (indicated by the dark areas) are not. The exposed areas are determined based on the aerial image intensity distribution, which is a function of the light blocking layer pattern formed on reticle 504 and various optical considerations, such as numeric aperture (NA), the wavelength $\lambda$ of the light, the amount of offset, the arrangement of the optical components, etc. For example, in accordance with the binary contact aerial image intensity curve 511, the exposed areas correspond to areas under the portion of the aerial image intensity curve that are above a resist exposure threshold 520, while those areas under the portions of the aerial image falling below the resist exposure threshold are not exposed.

Figure 6A:
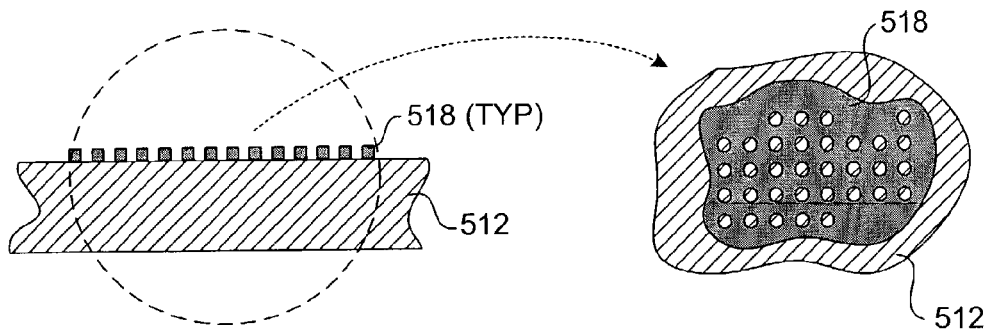
Figure 6B:
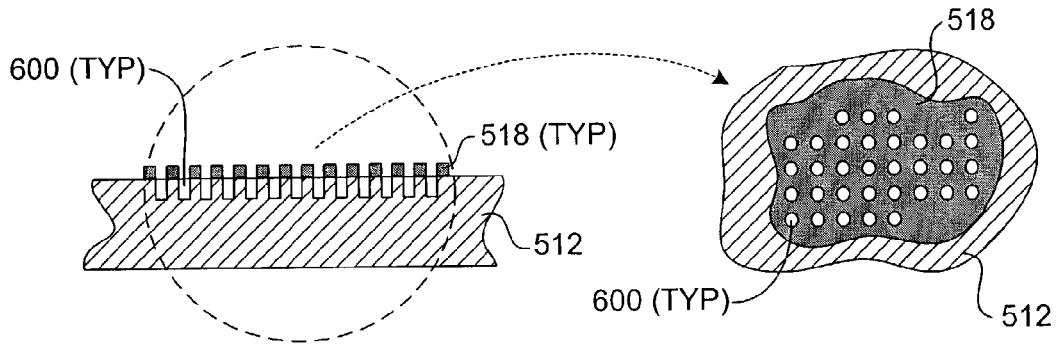
Figure 6C:
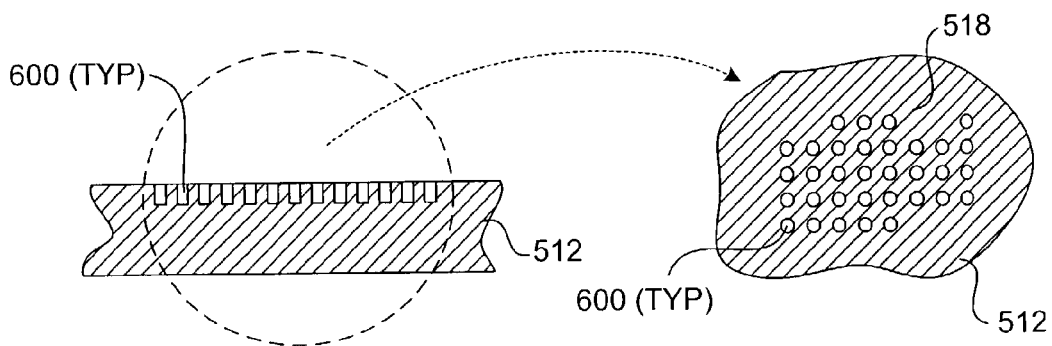

After the positive tone resist has been exposed, one or more processing steps are performed to develop away the exposed resist while leaving the unexposed areas of the resist. Exposure of the resist with sufficient light intensity causes a chemical change that makes it soluble in developer fluid. The resist so exposed is developed away by dissolving it in an appropriate solvent. The results of this process are shown in FIG. 6A. Next, an etching operation is performed to form contact holes 600 in substrate 512. Basically, the substrate (and resist). are exposed to a chemical etchant, which etches away portions of the substrate surface that are not covered with the resist, while leaving those areas covered with the resist alone. The net result of this etching operation is shown in FIG. 6B. Finally, the unexposed portion 518 of the resist is removed using an appropriate chemical shown in FIG. 6G. Subsequent to this operation, the contact holes are filled with a conductive material such as aluminum to form the contacts (not shown).

Figure 7A:
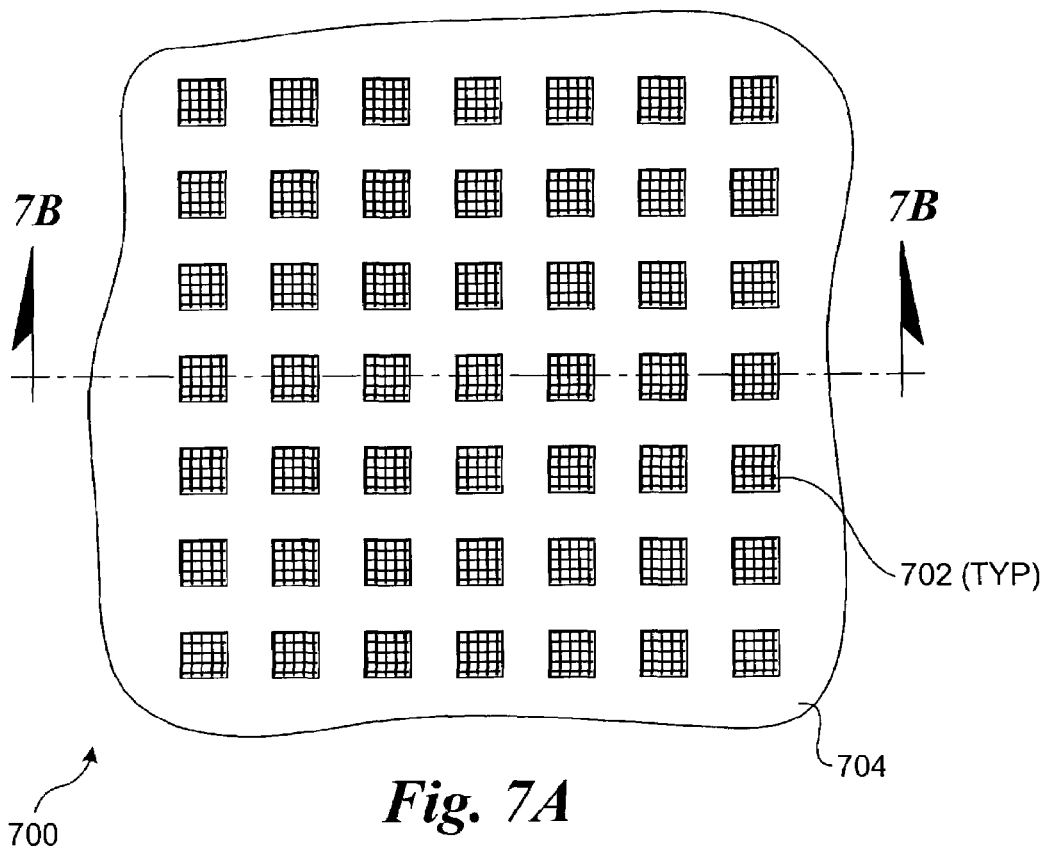
FIG. 7A is a plan view of a CPL mask pattern comprising a plurality of recesses formed in a quartz reticle by which contacts can be formed in accordance with an embodiment of the invention.
Figure 7B:
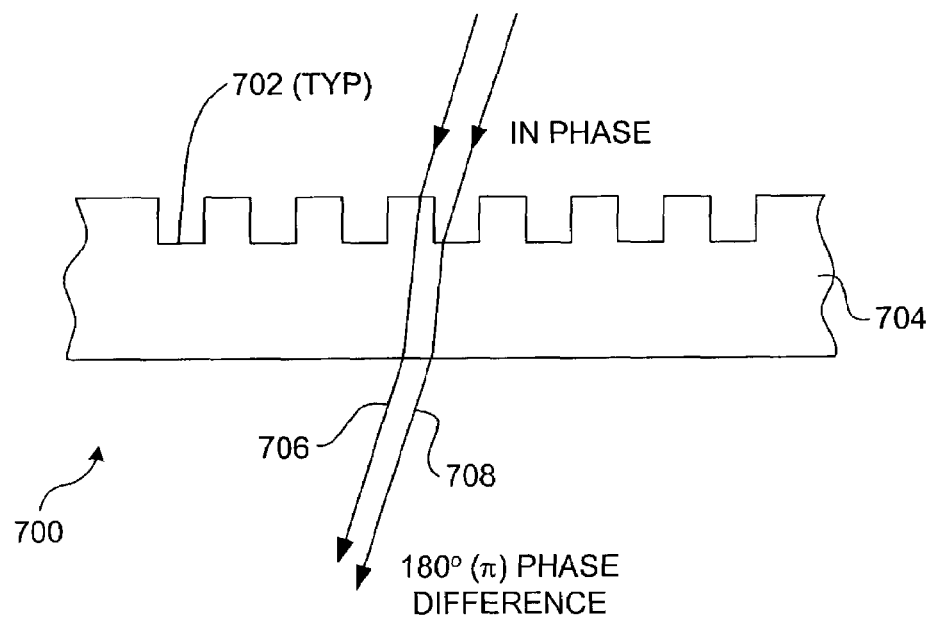
FIG. 7B illustrates a cross-section view of the CPL mask of FIG. 7A, taken along section cut 7B-7B.

In accordance with aspects of the invention, details of an improved method for forming contact holes that employs a CPL mask and negative tone resist are now disclosed. Rather than employing a chrome pattern, the CPL mask 700 employs a plurality of phase-shifting areas interspersed with non-phase-shifting areas, wherein the phase-shifting recesses pattern individual contacts to be formed in the semiconductor substrate. For example, a CPL mask 700 in accordance with a first embodiment of the invention is shown in FIGS. 7A and 7B, and includes a plurality of phase-shifting features comprising recesses 702 to define where the contact holes are to be formed. Each recess patterns a separate contact. The recesses are formed in a quartz reticle 704 such that the phase of light 708 passing through the recessed portion of the reticle is shifted in phase 180° from light 706 passing through the non-recessed portions. In contrast to the chrome-patterned reticle or the ePSM, the transmissiveness of both the recessed and non-recessed areas is substantially 100%.

Figure 8A:
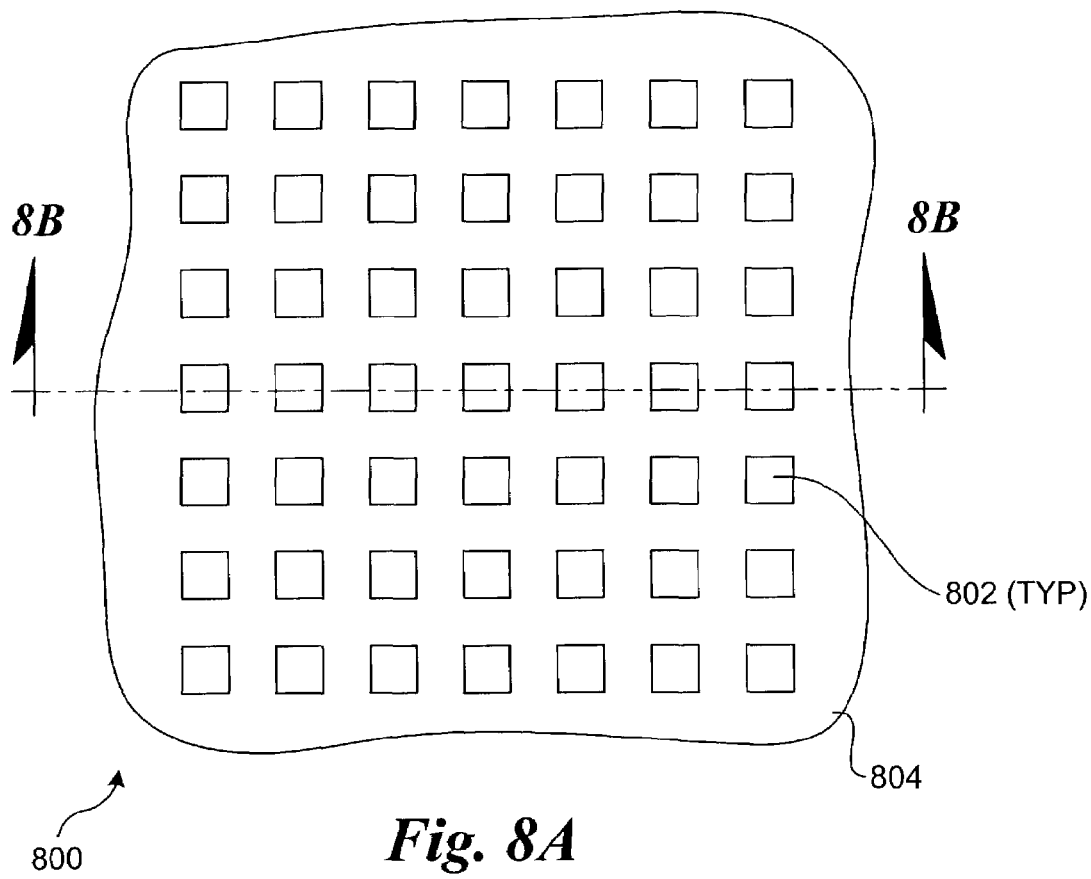
FIG. 8A is a plan view of a CPL mask pattern comprising a plurality of mesas formed on a quartz reticle by which contacts can be formed in accordance with an embodiment of the invention.
Figure 8B:
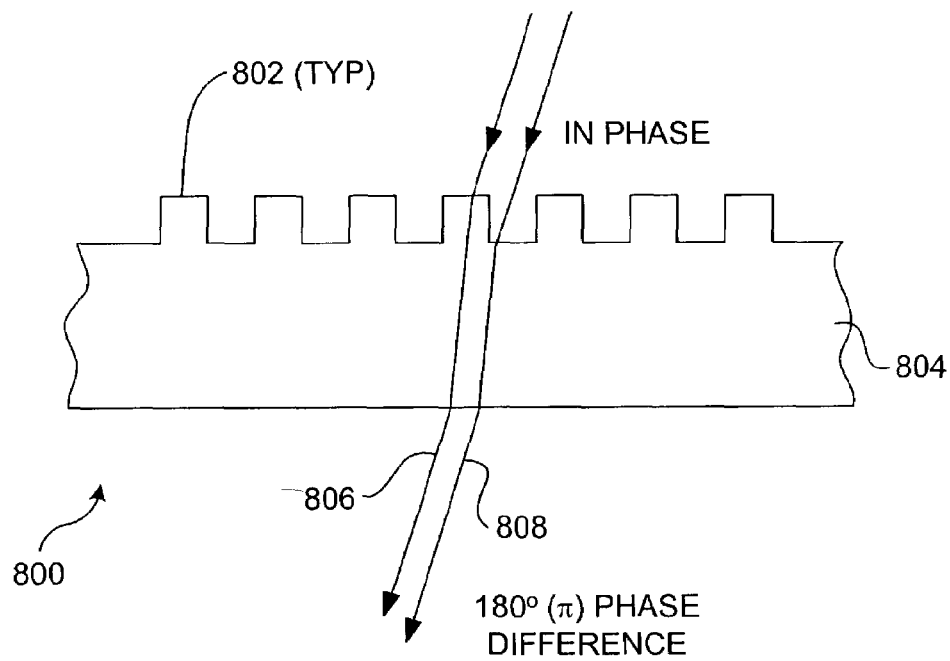
FIG. 8B illustrates a cross-section view of the CPL mask of FIG. 8A, taken along section cut 8B-8B.

A second embodiment comprising a CPL mask 800 is shown in FIGS. 8A and 8B. In CPL mask 800, the phase-shifting features comprise a plurality of mesas 802 extending upward from a quartz substrate 804. The height of the mesas is selected such that light passing through a mesa (e.g., depicted by a ray trace 806) is phase shifted 180° from light passing through non-mesa (non-phase-shifting) areas of the mask (depicted by a ray trace 808).

Difference Between CPL Contact Patterning and CPL Line/Space Patterning

Several factors distinguish the contact layer from line/space layers when it comes to the use of CPL, which make the contact layer amenable to the use of CPL as described herein. The first is the nature of the contacts. Many of the constraints restricting the use of CPL for lines and spaces are automatically non-issues for contacts as drawn on the CPL reticle in this invention. For example, for a given IC, the contacts are generally of the same small size suited to CPL, and arranged in a relatively simple layout (e.g., an array), when compared with the more complex line/space layer configurations common to complex IC's. This makes mask design and OPO (optical process correction, also referred to as optical proximity correction) much simpler. For example, line/space patterning with CPL requires the use of chrome or fine CPL gratings for wide line or landing pad patterning in addition to the recessed phases phase-shifting features used to form finer lines and features, therefore requiring two types of OPC: one for chrome and one for the phase-shifting features.

Figure 1:
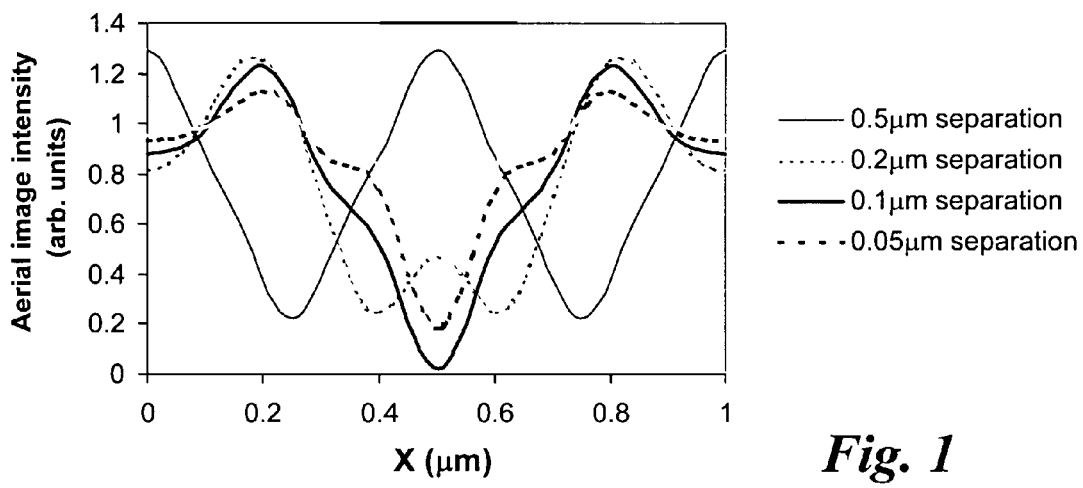
FIG. 1 is a diagram illustrating an aerial image intensity of two phase edge vs. phase edge separation for a CPL mask.
Figure 2:
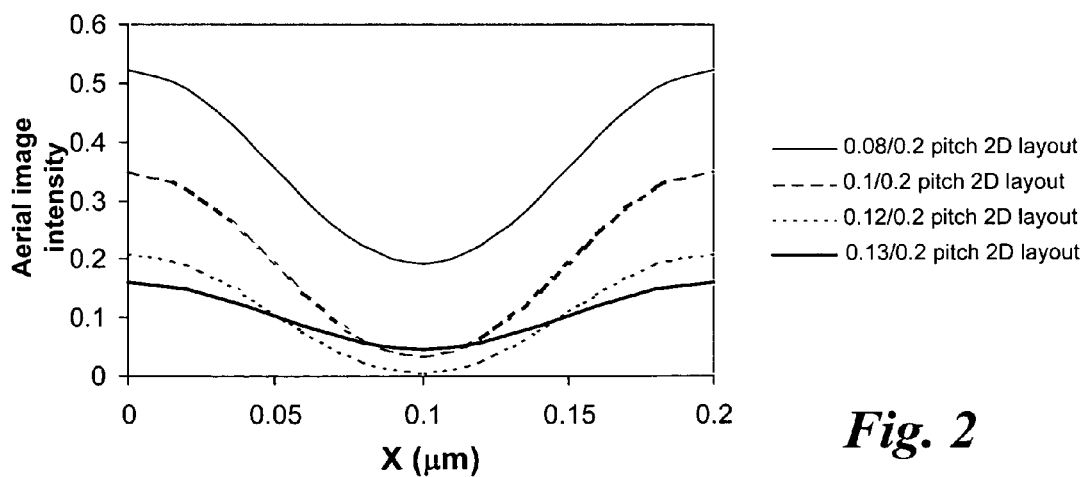
FIG. 2 is a diagram illustrating aerial image intensity vs. CPL co size for a two-dimensional grid having a 0.20 µm pitch.
Figure 3:
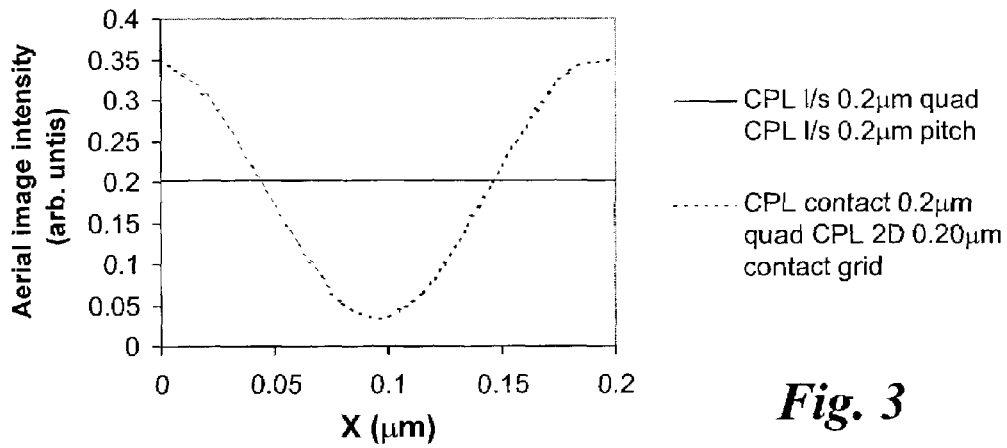
FIG. 3 is a diagram comparing aerial image intensities of dense line/space and dense contact grid pattering at 200 nm pitch for a CPL mask.

In contrast, only very simple sizing may be required for contact CPL in accordance with the principles disclosed herein. Most surprising, however, is the fact that our simulations suggest that unlike line and space patterning with CPL, contact patterning does not completely fail at tight pitches, as illustrated in FIG. 3. In fact, the simulated aerial images of the densest contacts shown herein have very good image contrasts and excellent DOE (depth of focus). Furthermore, results of the aerial image simulations shown herein suggest that dense contact patterning with CPL in combination with off-axis illumination (OAI) is not only possible, but also significantly better than the corresponding binary patterning with high sigma conventional illumination used today.

Negative Tone Resist

Heretofor, previous strategies for patterning using CPL implicitly assumed the use of positive tone resists, which comprise the vast majority of existing 157 nm, 193 nm and 248 nm photoresists. By its nature, CPL is a bright field mask resolution enhancement technique. For positive resists therefore, there is no simple way to pattern contacts. Tricks requiring more complex mask patterns have been demonstrated but require sophisticated algorithms to generate the mask patterns and very often the mask patterns do not look anything like what one is trying to pattern. This constrains the usefulness of chromeless technique to layers, such as PLY (polysilicon), which are mostly resist free with narrow lines of resist interspersed. Layers for making patterned contacts, which typically comprise sheets of resist with small holes interspersed or metal layers which can have tightly packed resist lines are not ideal candidates for CPL with positive tone resists. Strategies have been used to try to make CPL work for the metal and contact layers with positive tone resists but such strategies require making the masks much more complicated than they are for binary masks. For example, to keep light transmitted through the quartz between the contacts from reaching the wafer and exposing the resist, a diffraction grating of alternating 0 and 180 degree phase shifting lines would have to be added. The grating serves to diffract the light from between contacts out of the collection angle of the projection lens. By contrast, the use of a negative tone resist makes this unnecesasary and allows the use of simple intuitive layout schemes that are similar to those currently employed for binary masks and ePSMs for making patterned contacts. Thus, using a negative tone resist to pattern contacts can potentially take full advantage of CPL without incurring a mask layout complexity penalty.

CPL Patterning Improvement with Off-Axis Illumination

Figure 9:
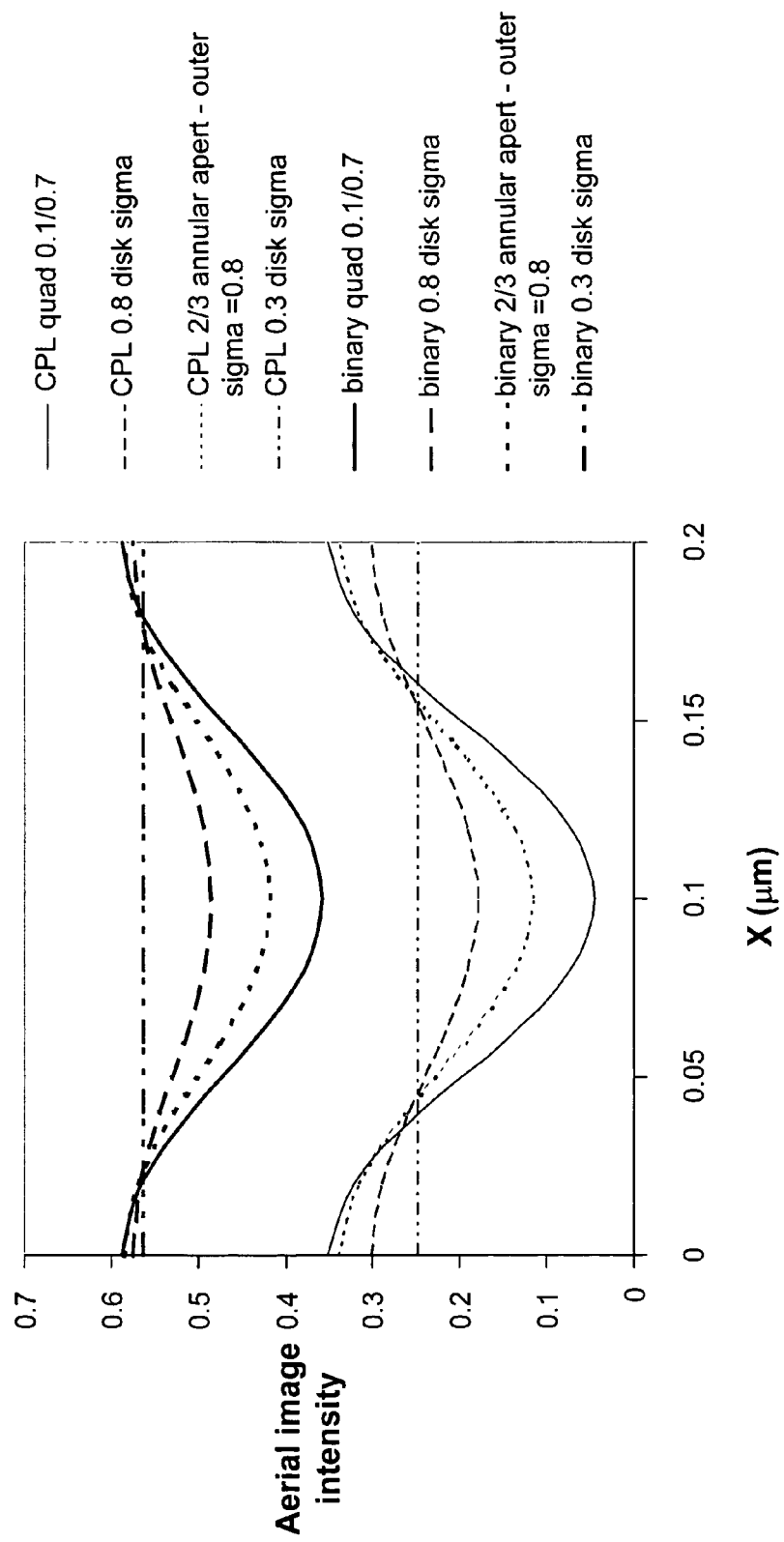
FIG. 9 is a graphic depicting various aerial image intensity curves corresponding to respective CPL and binary mask configurations.

Simulations have shown that CPL contact patterning can be further improved through the use of off-axis illumination, as illustrated in the simulation results plotted in Figure 9. The plot shows the aerial images of a 100 nm contact in a 200 nm pitch 2D square grid of contacts for various illumination conditions (0.3 sigma, 0.8 sigma, ⅔annular, and on-axis quadrupole), with a CPL contact as described above, and a 100 nm chrome pad. The effect of the stronger off-axis illumination at this pitch is to improve the contrast of the aerial image dramatically. Note also the strong effect of the chromeless phase shift technique in lowering the baseline light intensity at the center of the contact, which directly improves image contrast. Although the on-axis quadrupole illumination appears to provide the best dense pitch image contrast of the illumination options explored, it should be remembered that the effects of the quadrupole illumination will be strongly pitch dependent and there may be other pitches for which a different illumination condition would be a better choice.

Exemplary Implementation of a CPL Mask for Contact Patterning

Figure 10:
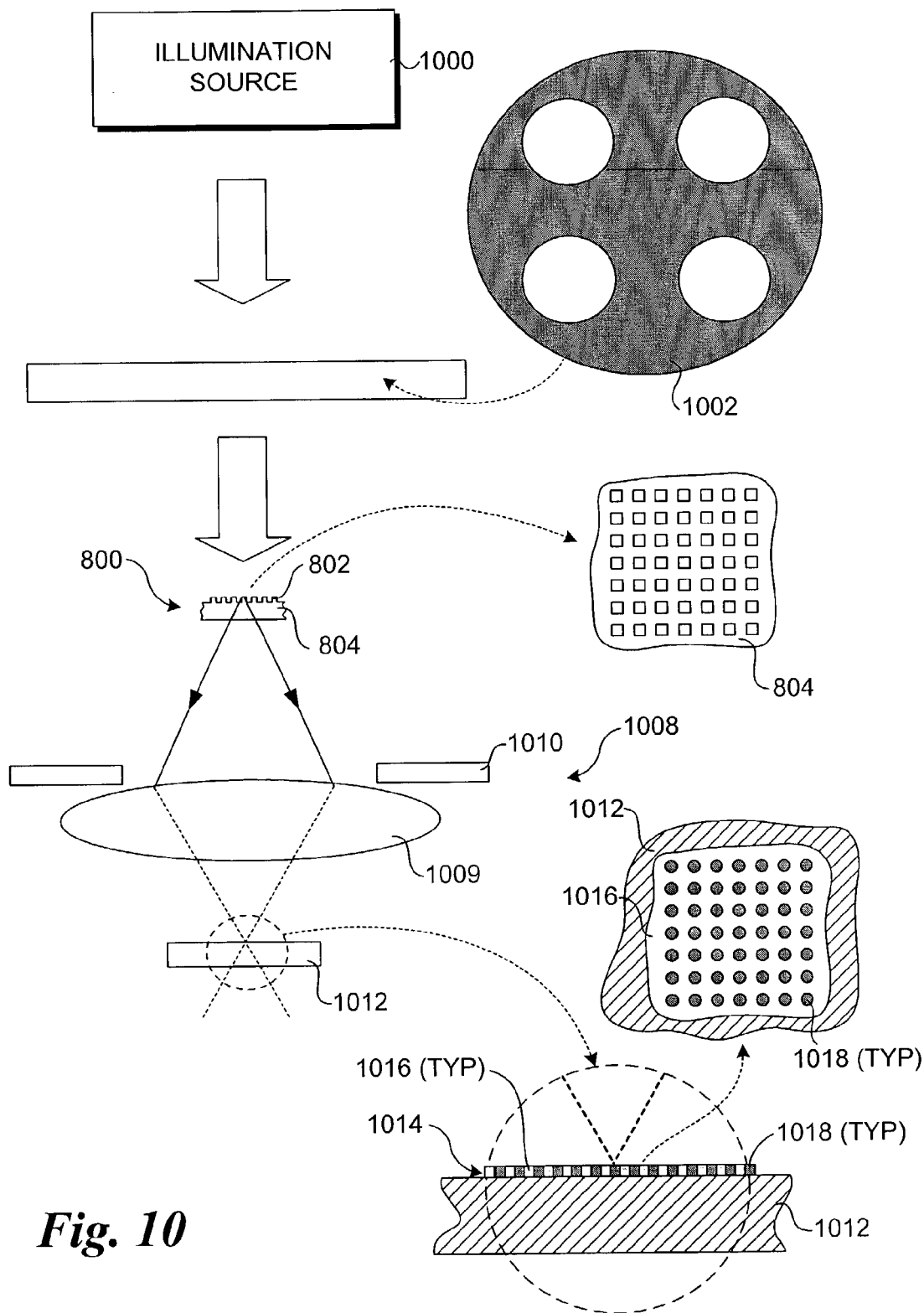
FIG. 10 is a schematic diagram illustrating a photolithography process for forming contacts employing a CPL mask in accordance with principles of the invention.

An exemplary lithography apparatus employing CPL mask 800 to pattern contact holes in a semiconductor substrate 1012 is shown in FIG. 10. In general, the lithography apparatus of FIG. 10 operates in a manner similar to that discussed above with reference to FIG. 5A, except in this instance a CPL mask is used in place of a chrome mask. The apparatus employs a short wavelength illumination source 1000, which emits light at a wavelength appropriate for the process (e.g., 248 nm, 193 nm or 157 nm). The light is redirected by an optical element 1002 to produce a set of quadrupole light sources. The quadrupole light poles are positioned to be off the stepper optical axis, so that light emitted directly downward from a light source does not impinge on the reticle, while light emitted at or above a predetermined angle does reach the reticle. For purposes of clarity, the features on the reticle are exaggerated.

As discussed above, portions of the light impinging on the mesa areas of the mask are shifted 180° in phase when they pass through the mask. Portions of the light impinging on areas of the mask that are not occupied by mesas 802 are allowed to pass through the mask without a phase shift. These portions of light then pass through a projection system 1008, depicted as a lens 1009 disposed behind an aperture 1010, whereby the light is redirected toward a focal area in which semiconductor substrate 1012 is placed.

As shown in the blown-up detail of FIG. 10, a negative tone resist layer 1014 is applied (e.g., via spin coating) to the top surface of substrate 1012. Some areas of the resist 1016 (indicated by the light areas) are exposed to the higher intensity light rays, while other areas 1018 (indicated by the dark areas) are not, based on the phase shift intensity cancellation effects discussed above and the corresponding aerial image intensity distribution. The exposed areas are determined based on the phase-shifting feature (i.e., mesa) pattern formed on CPL mask 800 and various optical considerations, such as numeric aperture (NA), the wavelength $\lambda$ of the light, the amount of offset, the arrangement of the optical components, etc. An exemplary aerial image intensity curve 1020 indicative of such an intensity distribution is shown in FIG. 5B. In a manner converse to that discussed above with respect to positive tone resists, areas exposed to the portion of the aerial image intensity curve 1020 above the resist exposure threshold 520 are exposed, while areas exposed to the portion of the aerial image intensity curve falling below the exposure threshold are not exposed.

Figure 11A:
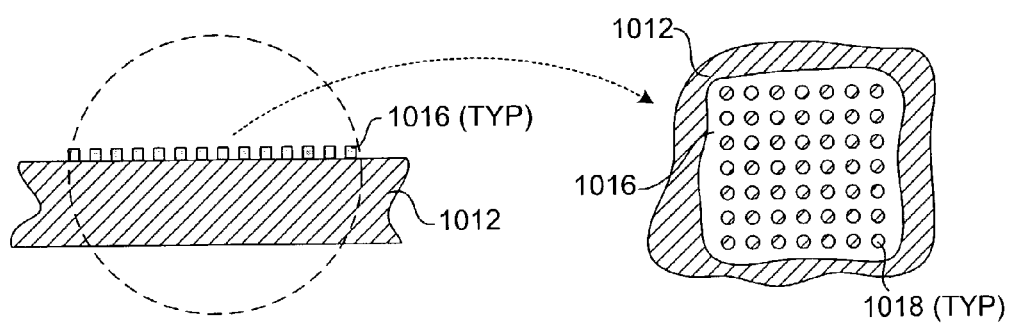
Figure 12:
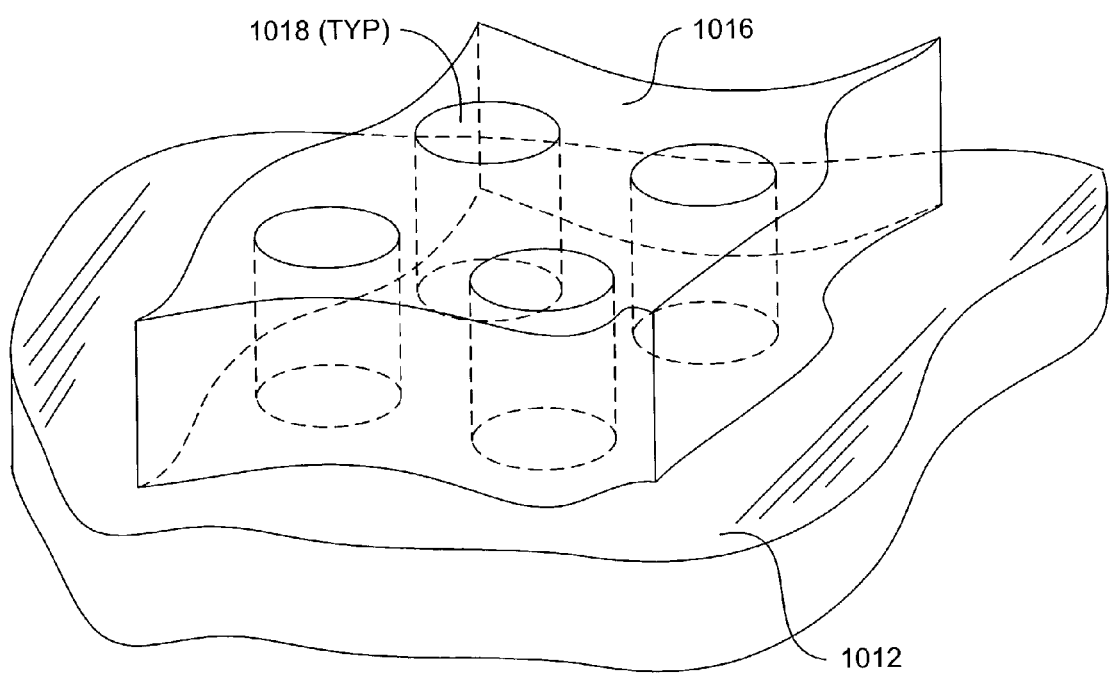
FIG. 12 is an isometric view illustrating the formation of contact holes in a layer of negative tone resist after the unexposed areas of the resist have been removed.

After the negative tone resist has been exposed for a sufficient time, one or more processing steps are performed to develop the resist and remove the unexposed areas of the resist, while leaving the exposed areas of the resist. In accordance with negative tone resist characteristics, exposure of the resist to a sufficient intensity level of light (e.g., above exposure threshold 520) causes a chemical change, whereby polymer cross-linking occurs in the resist so as to render these resist areas insoluble to developer. Thus, during the subsequent chemical wash operation, the areas of the resist that are not exposed to the higher intensity levels are removed, while the exposed areas remain. The results of these process operations are schematically illustrated in FIG. 11A and FIG. 12.

Figure 11B:
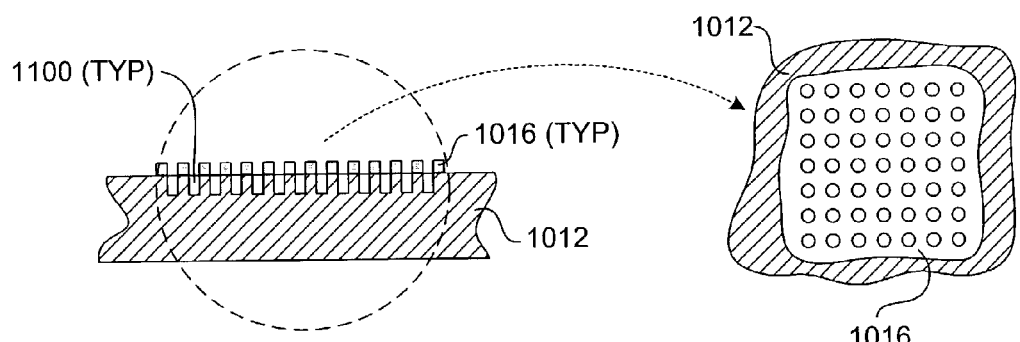
Figure 11C:
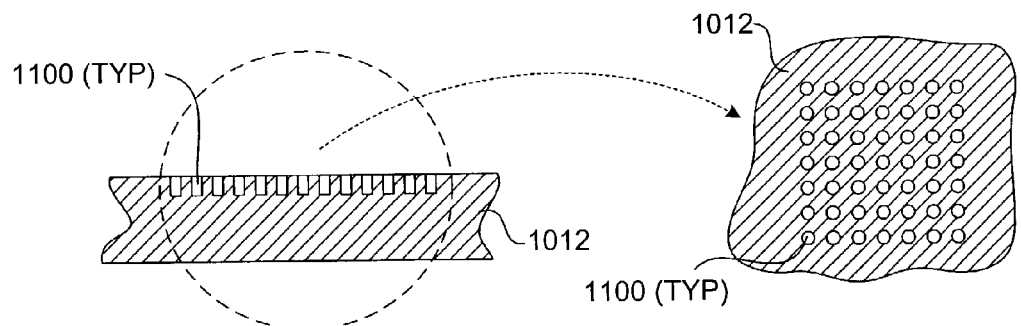

Next, an etching operation is performed to form contact holes 1100 in substrate 1012. Basically, the substrate (and resist) are exposed to a chemical etchant, which etches away portions of the substrate surface that are not covered with the resist, while leaving those areas covered with the resist alone in a manner similar to the positive tone resists discussed above. The net result of this etching operation is shown in FIG. 11B. Finally, the exposed portion 1016 of the resist is removed using an appropriate chemical process, leaving the substrate appearing as shown in FIG. 11C. Subsequent to this operation, the contact holes are filled with a conductive material such as aluminum to form the contacts (not shown).

The patterning methods corresponding to the various embodiments discussed above provide significant advantages over the existing art. It is widely recognized that one of the major shortcomings of CPL when patterning lines and spaces is that the aerial image contrast degrades with decreasing pitch to the point where all imaging information is lost at 1:1 duty cycle at the tightest pitches (as shown by the solid line curve in FIG. 3). Various approaches have been developed to address the problem of patterning tight line/space pitches with CPL, such the half-toning technique disclosed in U.S. Pat. No. 6,335,130, and the combined use of chrome and chromeless features discussed above. However, simulations (see FIG. 3) have verified that the aerial image of contacts patterned with phase shifting islands behave qualitatively different than those for line and spaces. At small pitches where line/spaces cease patterning, contacts still maintain a sufficient aerial image contrast for patterning. Contact layer patterning as described herein is more amenable to use with chromeless phase shifting techniques without the use of elaborate tricks to make patterning work in the wide range of pitches required for semiconductor circuit layouts. Furthermore, as shown in FIG. 5B, under the same stepper conditions, CPL contact patterning enables contacts with finer critical dimensions (e.g., diameter) to be formed when compared with the conventional binary mask techniques. Thus, existing steppers may be used to form contact patterns having feature sizes and grid densities finer than could be patterned with those steppers under conventional contact patterning techniques.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for patterning contacts, comprising;

illuminating a chromeless phase shift lithography (CPL) mask, the mask comprising a quartz reticle having a pattern of a plurality of phase-shifting features comprising recesses interspersed with non-phase-shifting areas, wherein each recess is to pattern a separate contact wherein the phase-shifting features are to pattern contacts, wherein the CPL mask is illuminated with a deep ultra-violet (DUV) wavelength light source, wherein light passing through the phase-shifting features is phase-shifted one hundred eighty degrees relative to light passing through the non-phase-shifted areas of the CPL mask; and passing the phase-shifted and non-phase-shifted light through projection optics to project an aerial image onto a layer of a negative tone resist applied over a semiconductor substrate to pattern the contacts in the negative tone resist, wherein the contacts are patterned using a single exposure of the DUV wavelength light source.

2. The method of claim 1, wherein the phase-shifting features are arranged in a pattern to produce an array of contacts having a pitch of approximately 200 nanometers or less.

3. The method of claim 1, wherein the phase-shifting features are arranged in a pattern to produce contacts having a critical dimension of approximately 100 nanometers or less.

4. The method of claim 1, wherein the DUV wavelength light source produces light having a wavelength of one of 248, 193, or 157 nanometers.

5. The method of claim 1, further comprising the operations of:

developing the negative tone resist;

removing portions of the negative tone resist not exposed by the aerial image; and etching a plurality of contact holes in the semiconductor substrate in areas of the semiconductor substrate surface having the negative tone resist removed.

6. The method of claim 1, wherein the phase-shifting features comprise a plurality of squares configured in a substantially square grid, and the contacts formed in the negative resist are substantially circular in shape.

7. A method for patterning contacts in a semiconductor substrate, comprising;

off-axis illuminating a chromeless phase shift lithography (CPL) mask, the mask comprising a quartz reticle having a pattern of a plurality of phase-shifting features comprising recesses interspersed with non-phase-shifting areas, wherein each recess is to pattern a separate contact, wherein the phase-shifting features are to pattern contact, wherein the CPL mask is illuminated with a deep ultra-violet (DUV) wavelength light source, wherein light passing through the phase-shifting features is phase-shifted one hundred eighty degrees relative to light passing through the non-phase-shifted areas of the CPL mask, said phase-shifting features arranged in a pattern; and projecting phase-shifted and non-phase-shifted light passing through the CPL mask onto a layer of negative tone resist applied over the semiconductor substrate to pattern the contacts in the resist, wherein the contacts are patterned using a single exposure of the DUV wavelength light source.

8. The method of claim 7, wherein a quadrupole illumination source is employed to produce the off-axis illumination.

9. The method of claim 7, wherein the DUV wavelength light source produces light having a wavelength of one of 248, 193, or 157 nanometers.

10. The method of claim 7, wherein the phase-shifting features comprise a plurality of squares configured in a substantially square grid, and the contacts formed in the negative resist are substantially circular in shape.

* * * * *